United States Patent
Leckelt et al.

(10) Patent No.: US 10,852,013 B2
(45) Date of Patent: Dec. 1, 2020

(54) U-SHAPED AIR TREATMENT ARRANGEMENT IN AN AIR HANDLING UNIT

(71) Applicant: REVOLVER 26 INVESTMENT CORPORATION, Phoenix, AZ (US)

(72) Inventors: Lindsey Leckelt, Sherwood Park (CA); Ryan Vetsch, Fort Saskatchewan (CA); Benoit Boudreau, Sherwood Park (CA)

(73) Assignee: REVOLVER 26 INVESTMENT CORPORATION, Phoenix, AZ (US)

( * ) Notice: Subject to any disclaimer, the term of this patent is extended or adjusted under 35 U.S.C. 154(b) by 359 days.

(21) Appl. No.: 15/678,603

(22) Filed: Aug. 16, 2017

(65) Prior Publication Data
US 2019/0056121 A1    Feb. 21, 2019

Related U.S. Application Data

(60) Provisional application No. 62/376,963, filed on Aug. 19, 2016.

(51) Int. Cl.
| F24F 7/00 | (2006.01) |
| F24F 3/044 | (2006.01) |
| F24F 13/10 | (2006.01) |
| F24F 13/28 | (2006.01) |
| F24F 13/30 | (2006.01) |
| H05K 7/20 | (2006.01) |

(52) U.S. Cl.
CPC .............. *F24F 3/044* (2013.01); *F24F 13/10* (2013.01); *F24F 13/28* (2013.01); *F24F 13/30* (2013.01); *H05K 7/20745* (2013.01); *H05K 7/20718* (2013.01)

(58) Field of Classification Search
CPC ........................................................ F24F 7/02
USPC .................... 454/237, 251–253, 333; 165/54
See application file for complete search history.

(56) References Cited

U.S. PATENT DOCUMENTS

| 2,884,228 A | 4/1959 | Jorgensen |
| 2010/0170292 A1 | 7/2010 | Narikawa et al. |
| 2012/0308214 A1* | 12/2012 | Tyburk ................... F24F 13/20 392/407 |
| 2014/0075977 A1 | 3/2014 | Elliott et al. |

FOREIGN PATENT DOCUMENTS

| EP | 0097607 | 1/1984 |
| WO | WO2012011865 | 1/2012 |

OTHER PUBLICATIONS

International Search Report and Written Opinion from PCT/US2017/047132 dated Nov. 20, 2017.

\* cited by examiner

*Primary Examiner* — Vivek K Shirsat
(74) *Attorney, Agent, or Firm* — Hueschen and Sage

(57) ABSTRACT

The present invention relates in general to a compact air handling system to supply conditioned air to a space including but not limited to, building rooms and data center server space. The present invention relates to the design and layout of the system for air handling unit system applications.

10 Claims, 10 Drawing Sheets

U-SHAPED AIR TREATMENT ARRANGEMENT IN AN AIR HANDLING UNIT

FIELD OF THE INVENTION

The present invention relates in general to a compact air handling system designed to supply conditioned air to a space including, but not limited to, building rooms and data center server space. The present invention relates to the design and layout of the system for air handling unit system applications.

BACKGROUND

Designers and developers of buildings are constantly striving to maximize the space available for usable space and minimize the space used by auxiliary equipment such as, but not limited to, mechanical or electrical equipment, and hardware. Designers and developers are also always looking for means to maximize building usage and footprint. This approach has resulted in limitations on the space available for air conditioning equipment, which space may be further confined due to property and building plot limitations.

Traditional air handling units have air treatment components such as coils, evaporative coolers, filters, et cetera and are one of the main driving factors for the unit foot print size. These components are typically laid out across the unit perpendicular to the airflow. Such layouts require an adequately sized cross sectional area, resulting in larger unit foot print including, but not limited to, the width. This limits the number of components such as, but not limited to, an air bypass that can be added into the air handling unit when the overall physical size of the unit is constrained.

Past and current compact air handling units have internal components staggered within the air handling equipment to minimize the overall air handling unit foot print including but not limited to the width. Staggered equipment within the air handler may result in increased air pressure drops resulting in higher energy consumption. Additionally, staggering components is limited in its scalability and is also limited in the number of components that can be added such as, but not limited to, air bypass.

One example of staggered air treatment component equipment within an air handler may be described as, but is not limited to, two air treatment components of equal lengths, shorter than the width of the unit but extending farther than the midpoint of the unit width, and placed perpendicular to the airflow in series with one air treatment component on either side of the unit. The free ends of both air treatment components furthest away from the unit walls are connected together by a diagonal wall to form a dividing section between air entering the treatment component and conditioned discharge air. In some examples, a bypass is added to the diagonal wall connecting the air treatment components together. The bypass in the staggered arrangement is limited in size, scalability, and effectiveness in providing air bypass where air may not effectively bypass the air treatment component(s). This staggered equipment configuration cannot be scaled, as increasing the amount of airflow would require the air treatment components to lengthen to keep industry standard face velocities, thus increasing the angle between the staggered air treatment components, resulting in narrow air paths. Narrow air paths increase the air pressure drop, where fans require additional power, and as a consequence increase power consumption. In addition to the aforementioned short comings of the staggered component layout, adding adequately sized and effective air bypass section(s) would require increasing the size of the unit foot print.

Having the ability to bypass the air conditioning component is beneficial in many cases. Such benefits include, but are not limited to, modulating the cooling or heating output of the air conditioning component and improving energy efficiency. Sizing considerations for the air bypass so that it is maximized, ensures the ability for optimum modulation and increased energy efficiency. If air bypass is limited due to size, modulating and energy efficiency may be compromised as a result. Traditional air handling unit arrangements and staggered arrangements are limited in bypass capacity and scalability.

Typical air treatment components also have face velocity sizing considerations which are integral to their effectiveness and energy efficiency. These components are traditionally installed perpendicular to the airflow path. In large systems with higher airflows and limited footprint, installing these components in a traditional perpendicular arrangement will increase face velocity and thus negatively affect the air treatment component's performance and reduce the energy efficiency.

In view of the foregoing demands of the industry, there is a need to produce high volume airflow, compact foot print air handling units with the ability to match adequately sized conventional air handling unit air treatment components while also allowing for optimized air bypass capabilities.

OBJECTS OF THE INVENTION

It is an object of the present invention to design a compact footprint, high volume airflow air handling unit which exhibits optimal energy efficiency performance and air conditioning modulating capabilities.

The invention utilizes a U-shaped air treatment arrangement and multiple airflow patterns to reduce the overall dimensional footprint while maintaining air conditioning performances of adequately sized conventional air handling unit air treatment components. The U-shaped air treatment arrangement enables the addition of a full width low resistance air bypass for added air treatment capacity modulation and increased energy efficiency.

SUMMARY OF THE INVENTION

What we consider to be our invention therefore may be described as an air handling unit advantageously comprising a U-shaped air treatment arrangement, which U-shaped air treatment arrangement extends completely between longitudinal walls, floor and ceiling of the air handling unit, thereby defining an air intake zone and an air outflow zone within the air handling unit, which U-shaped air treatment arrangement comprises, beginning at a first longitudinal wall of the air handling unit, a first secondary bypass wall, connected perpendicular to the first longitudinal wall, the first secondary bypass wall is connected in a perpendicular manner to a first primary air path wall running parallel to the first longitudinal wall, the first primary air path wall is connected via a first corner connection piece to a primary bypass wall which is positioned perpendicular to the first primary air path wall and distal from the first secondary bypass wall along the first primary air path wall, the primary bypass wall is connected via a second corner connection piece perpendicular to a second primary air path wall running parallel to the first primary air path wall and a second longitudinal wall of the air handling unit, the second primary air path wall is connected in a perpendicular manner to a second secondary bypass wall, which second secondary bypass wall is connected in a perpendicular manner to the second longitudinal wall, wherein, in conjunction with the floor and ceiling of the air handling unit, the afore-described U-shaped air treatment arrangement completely divides the air handling unit into an air intake zone and an air outflow zone.

Such an air handling unit, wherein the bypass walls are equipped with bypass dampers with optional air filtration or air conditioning component(s), and the primary air path walls are equipped with air conditioning components and air filtration with optional face dampers.

Such an air handling unit, wherein the bypass walls are parallel to the terminal walls, while the primary air path walls are substantially parallel to the longitudinal walls.

Such an air handling unit, wherein symmetrical construction along the longitudinal center line facilitates even airflow distribution in each primary air flow path.

Such an air handling unit, which exhibits industry standard or reduced airflow face velocity across primary air conditioning components and independently adequately sized bypass air flow paths within a reduced unit footprint.

Such an air handling unit, which provides independent airflow paths through primary air path walls, and bypass walls, thereby enabling the air handling unit to be multi-functional under various operating strategies and to be more energy efficient.

Such an air handling unit, wherein both primary air face dampers and bypass dampers are modulated together to provide greater levels of climate control.

Such an air handling unit, wherein, in one application, the primary air path walls are used for primary air flow conditioning, and the bypass walls are used for bypass airflow.

Such an air handling unit, wherein primary air flow conditioning is staged by closing one of two face dampers.

Such an air handling unit, wherein air filters are installed in parallel juxtaposition to the air conditioning device facilitating pressure equalization and enabling even airflow distribution through air conditioning device.

Such an air handling unit, wherein, in one application, the primary air path walls are used for cooling, while the bypass walls are used for heating, and vice versa.

DESCRIPTION

Figure 1A:
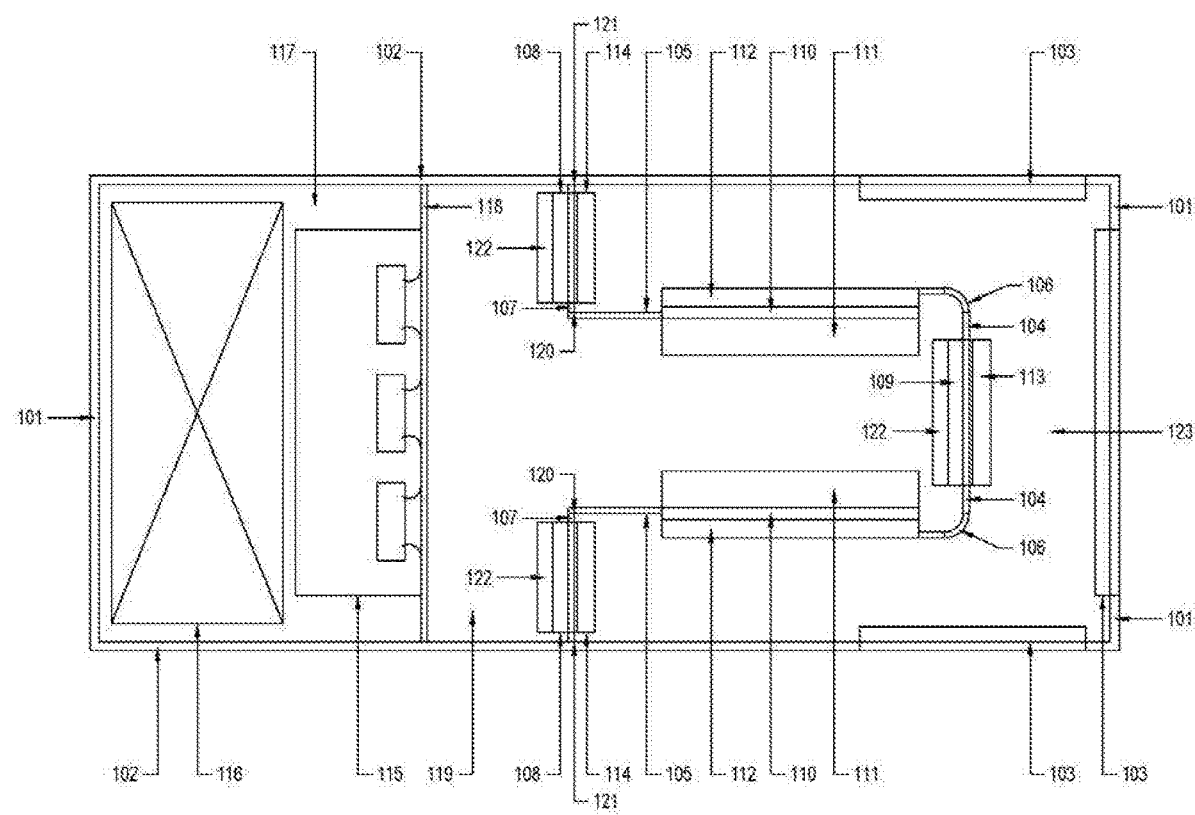
FIG. 1A is a plan view of the air handling unit with U-shaped air treatment arrangement shown in relation to typical air condition components such as, but not limited to fans, heat exchangers, economizers, filters, dampers, discharge and intake openings and other air controlling devices.

The present invention relates to an air handling unit with U-shaped air treatment arrangement which includes adequately sized bypass and provides optimized face area for reduced velocity through the primary air conditioning components. This enables greater energy efficiency, improved temperature modulation ability and greater airflow within a smaller foot print including, but not limited to, width compared to conventional prior art air handling unit arrangements including but not limited to staggered component arrangements. The embodiments of the invention enable multiple independent air flow pathways and various flow patterns.

The air handling unit with U-shaped air treatment arrangement is constructed in a similar manner to typical air handling unit enclosures, comprising terminal walls 101, longitudinal walls 102, unit floor 201, and unit ceiling 202. Air intake(s) 103 may be located on the terminal wall 101, longitudinal wall 102, unit floor 201 and/or unit ceiling 202. Supply fan(s) 115 is/are located in the supply plenum section 117 and air discharges out of the air handling unit through air outlet 116 which may be located in unit ceiling 202, terminal wall 101, unit floor 201, or unit longitudinal walls 102. Within the enclosure walls 101, 102, and supply fan bulkhead 118, lies components that comprise the U-shaped air treatment arrangement.

A primary bypass wall 104, creates the bottom of the U-shaped air treatment arrangement, is parallel to terminal wall 101, and extends from unit floor 201 to unit ceiling 202. The width of the primary bypass wall 104 is determined for adequate spacing for the air path between primary air path walls 105 and the longitudinal wall 102. The primary bypass wall 104 encompasses a primary bypass damper 109, an optional bypass filter bank 113, and an optional air conditioning component 122 installed at the center. The primary bypass wall 104 connects to a corner connection piece 106 that is curved 90° towards the fan section. The optionally removable corner connection piece 106 can have various bending radiuses or angles. Typical round bending curve corners 106 as shown in FIG. 1A facilitate smooth airflow.

The corner connection pieces 106 connect the primary bypass wall 104 substantially perpendicularly to primary air path walls 105 that run substantially parallel (i.e., within 20% of parallel) to the longitudinal walls 102, and extend from unit floor 201 to unit ceiling 202. In an embodiment, the primary air path walls 105 are positioned parallel to the longitudinal walls 102. The primary air path walls 105 comprise air conditioning component(s) 111 which condition air as required. The air conditioning component 111 may include but is not limited to chilled water coil, DX cooling coil, evaporator cooler, hot water heating coil, electric heating coil, or humidifier. Additionally, the primary air path walls contain a full sized air filtration bank 112, and optional full air face control damper 110. The two primary air path walls 105 are offset along the air handling unit longitudinal center line at a separation defined by the primary bypass wall 104 and corner connection pieces 106, and separated at a distance optimized to equalize face velocity over the primary air path walls 105. At one end 120 of the primary air path wall 105, distal to the primary bypass wall 104, the primary air path wall 105 connects to a secondary bypass wall 107 that is positioned substantially perpendicularly to the primary air path wall 105. The secondary bypass wall 107 connects to the longitudinal wall 102 on one end 121 and extends from unit floor 201 to unit ceiling 202. The secondary bypass wall 107 includes a secondary bypass damper 108 covering most areas of the wall. The secondary bypass wall may also include an optional filter bank 114 and an optional air conditioning component 122. The two secondary bypass walls 107 are offset along the longitudinal center line of the air handling unit.

Walls 104, 105, 107, bypass dampers 109, 108, air conditioning components 111, and corner connection pieces 106 comprise a divider between the air intake zone 123 and air outflow zone 119. This continuous surface forms the U-shaped air treatment arrangement and provides much larger area for airflow than a cross sectional surface perpendicular to the airflow. With the U-shaped air treatment arrangement providing more surface area, high volume airflows are achieved within a smaller unit dimension while keeping conventional or reduced industry standard face velocities through primary air cooling/heating, filtration and control damper components. The U-shaped configuration allows for additional airflow patterns through the unit with the addition of multiple air bypasses through available additional space created by the U-shaped air treatment arrangement.

The U-shaped air treatment arrangement creates additional surface area within a reduced sized air handling unit foot print while maintaining industry standard face velocities through primary air treatment components as compared to a conventional air handling unit with primary air treatment arrangements installed perpendicular to air flow. Due to the placement of the primary air treatment components substantially parallel to air flow, the air flow must change its direction from longitudinal flow to cross flow to the primary air flow. Moreover, the positioning of dampers and filters in series at the primary air treatment components provides for an equalization of face velocity and/or air pressure across the full face of the air treatment components, maximizing filter performance and cooling/heating efficiency. Maintaining industry standard or lower face velocities through filters and air treatment components ensures the optimum performance, effectiveness of components, and maintains a low air pressure drop that contributes to low fan power consumption thus superior energy efficiency. A reduced foot print, including but not limited to, the width, delivers substantial floor space to provide higher overall air flow by placing multiple units in the limited foot print or maximize usable building space. In contrast, installing primary air treatment components such as filters and air conditioning components conventionally perpendicular to air flow, while trying to match the air handling unit foot print width of the air handling unit with U-shaped air treatment arrangement, would result in a significant increase in air treatment face velocities, leading to increased air pressure drop, reduced air conditioning performance and reduced energy efficiency.

Moreover, the U-shaped air treatment arrangement integrates separate independently controlled primary and secondary bypass air flow within a reduced sized air handling unit foot print. Independently controlled primary and bypass air flow facilitates immense energy savings when air conditioning is not required in the conditioned space delivered by the air handling unit and primary air treatment components are fully bypassed. The bypass sections within the U-shaped air treatment arrangement are sized for industry standard or lower face velocity through bypass components, thus promoting optimum effectiveness and better energy efficiency. Having an integrated air bypass allows air to bypass primary air treatment components when air conditioning is not needed, eliminating unnecessary expenses of operating and wear on expensive air conditioning equipment, reducing maintenance cycles, and increasing overall energy usage efficiency. Traditional air handling units with primary air treatment components perpendicular and/or staggered to the air flow restricts the installation of bypass filters and dampers sized to industry standard face velocities, without having to substantially increase the unit footprint including, but not limited to, width.

Air handling units with a U-shaped air treatment arrangement providing the above-described component face velocities within a reduced sized footprint provide significant benefits to end users of the equipment. The air handling unit with U-shaped air treatment arrangement enables the unit to be multi-functional and efficient to operate under various strategies. The full area of the U-shaped air treatment arrangement is easily accessible from both entering and leaving air sides, which provides benefits to operation and maintenance, such as, but not limited to, periodic filter replacements and air conditioning components cleaning.

The air handling unit with U-shaped air treatment arrangement may be equipped with various instruments and controls devices, such as, but not limited to, temperature, humidity, airflow, flood sensors, and actuators that are typical in the industry to facilitate unit control, operation and monitoring to provide design air flow volume and conditioned air under various circumstances. Various mechanical hardware and auxiliary accessories, such as, but not limited to, lighting, switches, and fire suppression systems, wherein the components are industry standard, may be installed in the air handling unit for unit operation and maintenance.

In a typical application as depicted in FIG. 1A, the primary air path walls 105 are used for primary air conditioning and the air conditioning components 111 are sized for conventional or reduced face velocity. The primary bypass wall 104 and secondary bypass walls 107 are used for bypass airflow. With the conventional air handling unit arrangement, options for adding multiple airflow paths and air bypass are very limited or unavailable without further increasing the air handling unit cross sectional area and overall footprint. The U-shaped air treatment arrangement achieves both industry standard and/or reduced airflow face velocities across air conditioning components, and addition of full face bypass airflow within a reduced footprint.

Figure 1B:
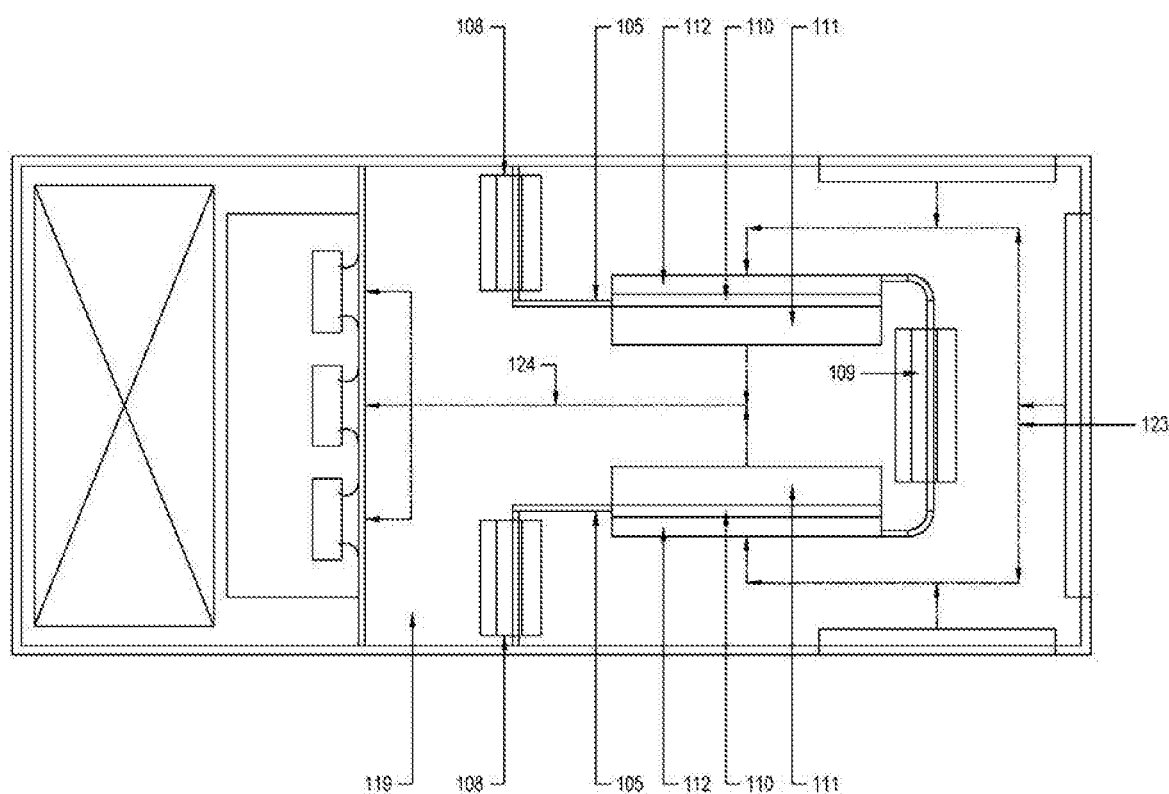
FIG. 1B is the plan view of the air handling unit displaying the unrestricted airflow pattern through primary air conditioning components installed in the U-shaped arrangement with no air bypassing.
Figure 1C:
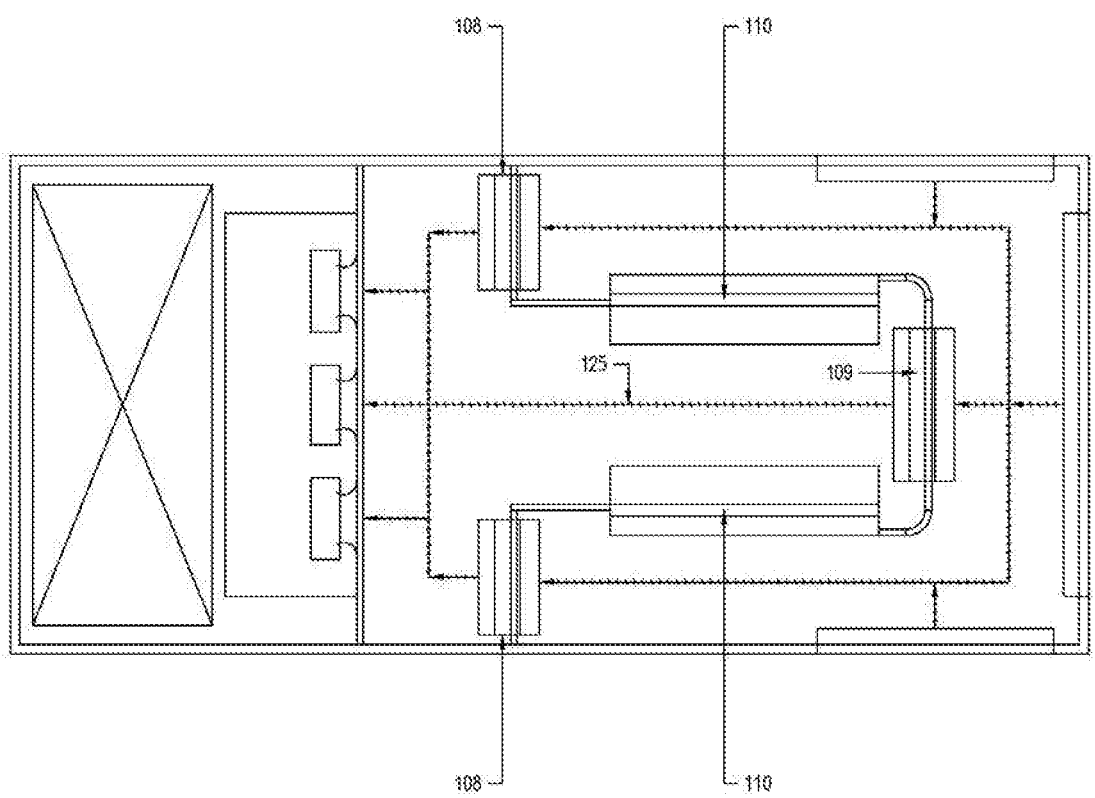
FIG. 1C is the plan view of the air handling unit displaying the airflow bypassing the primary air conditioning components installed in the U-shaped arrangement.
Figure 1D:
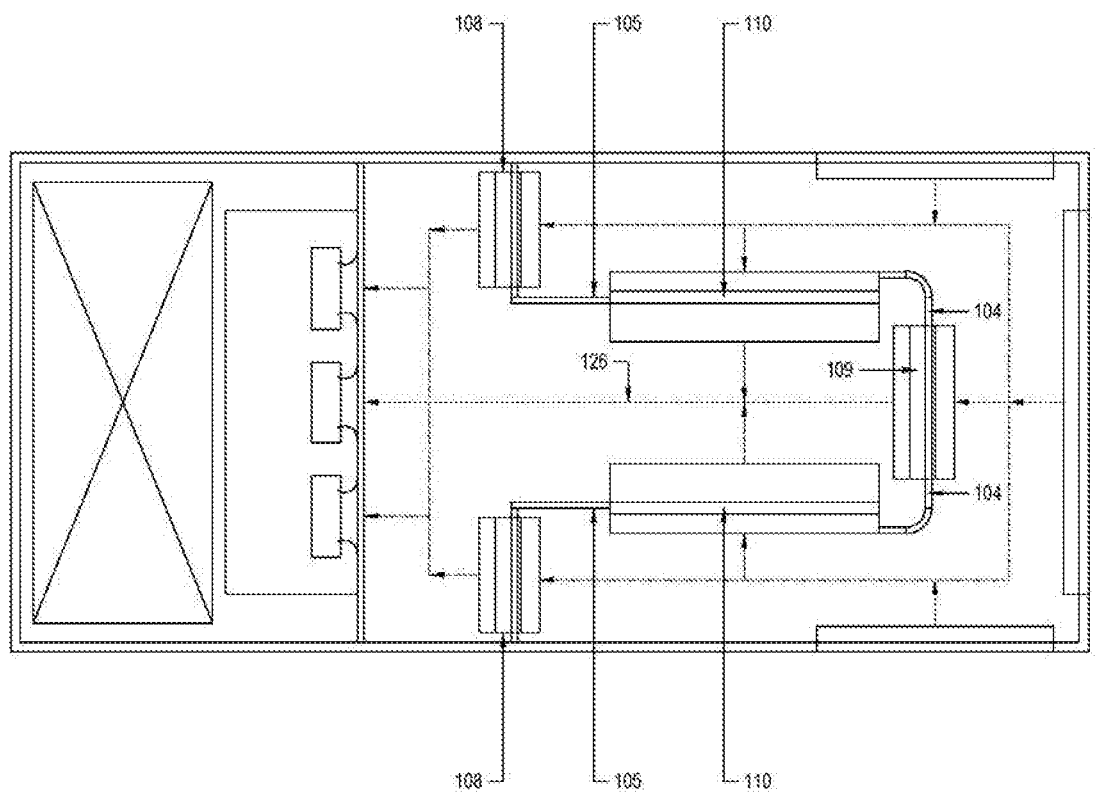
FIG. 1D is the plan view of the air handling unit displaying the airflow partially bypassing and partially through the primary air conditioning components installed in the U-shaped arrangement.
Figure 2:
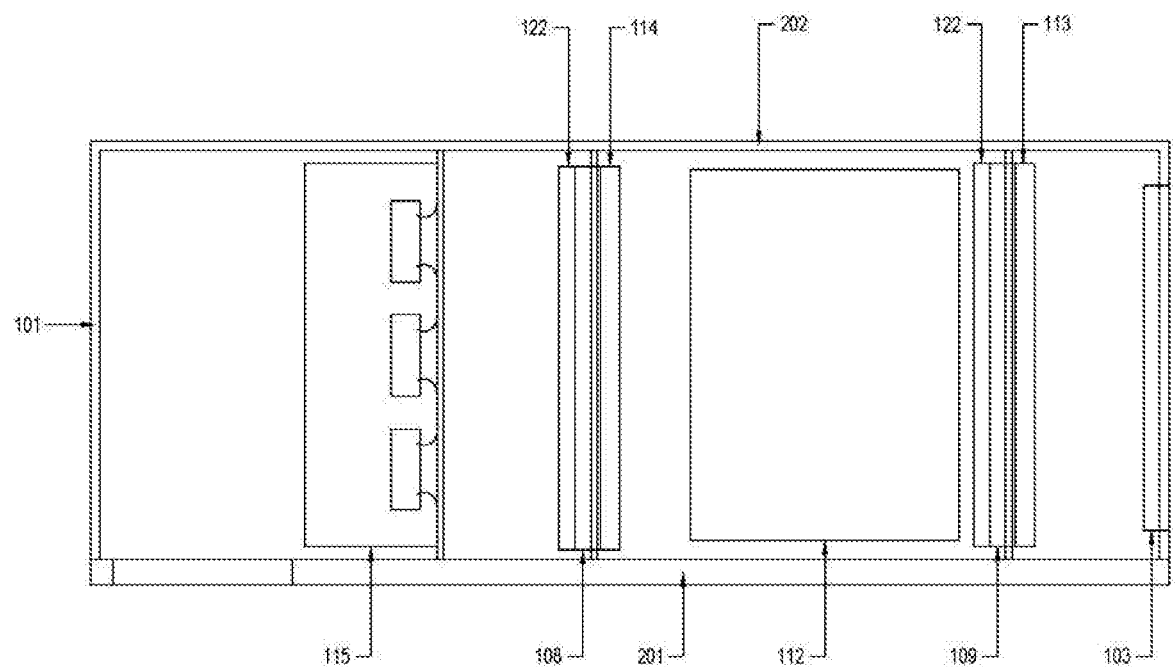
FIG. 2 is the elevation profile view of the air handling unit with U-shaped air treatment arrangement in relation to typical air condition components such as, but not limited to, fans, heat exchangers, economizers, filters, dampers, discharge and intake openings and other air controlling devices.

Airflow patterns are shown in FIG. 1B, FIG. 1C, and FIG. 1D under different operation modes. FIG. 1B shows primary air flow path 124 when bypass dampers 109 and 108 are closed. From air intake zone 123 to air outflow zone 119, two separate air paths are formed across each primary air path wall 105 and air conditioning component 111. Air flows through the primary air treatment components contained within primary air path walls 105 sequentially. Since the two primary air paths are mirrored along the unit longitudinal center line, a symmetrical layout promotes evenly distributed airflow across each air conditioning device 111 over a large surface area. Installing air filters 112 in parallel juxtaposition to the air conditioning device 111 facilitates pressure equalization that promotes even airflow over the air conditioning device. The air flow leaving each air treatment component path is directed towards each other, facilitating good air mixing thus eliminating the need of an air de-stratification device. Moreover, with optional face dampers 110, one of the main air primary air flow paths may be closed, allowing the unit to stage air conditioning devices for finer tuning of, but not limited to, temperature control. This staging ability provides superior performance modulation from a controls standpoint and may aid in reducing energy consumptions. The optional face dampers 110 installed in series to the primary air conditioning device 111 can be closed completely, thereby eliminating airflow completely through the primary air path components contained in primary air path wall 105. This is an added control feature that adds potential benefit during times when additional air conditioning means are not required for air being delivered to conditioned space.

FIG. 1C shows the bypass air flow paths 125 through primary bypass damper 109 and secondary bypass dampers 108 with the face dampers 110 completely closed. All of the airflow is directed through the bypass air path. Bypass dampers 109 and 108 are adequately sized for with appropriate surface area to provide satisfactory bypass airflow for modulation, and can aid to relieve air pressure drop across the air handling unit system resulting from the elimination of the primary air conditioning device from the air path. Air conditioning devices such as fin and tube coils, evaporative coolers, et cetera have higher pressure than that of low velocity dampers. Decreasing the air pressure drop reduces fan power consumption and thus increases system energy efficiency. When the bypasses are so equipped, similar to the primary air flow pattern, independent airflow through each air bypass pathway can be achieved by opening or closing bypass dampers 108, 109, permitting high flexibility of controlling bypass airflow.

One example of utilizing bypass airflow is during free cooling operation. Free cooling is used when outside air conditions are favorable to deliver the cooling means necessary to provide the proper controlled climate within the conditioned space maintained by the air handling unit. During times of free cooling, air can be completely bypassed around primary air treatment components by fully closing face damper 110, and opening bypass dampers 108 and 109, eliminating unnecessary wear on but not limited to, expensive cooling/heating and filtration components, greatly reducing maintenance cycles including but not limited to filter changes. The air handling unit with the U-shaped air treatment arrangement allows for the closure of the primary air path since it includes a full air bypass that encompasses the entire face of the air handling unit enclosure. The entire air bypass area contained within the U-shaped air treatment arrangement includes face velocities through filter banks and bypass dampers well within industry standard velocities, resulting in energy efficiency equal to, or better than, when air travels through the primary air path treatment components contained within the primary air walls 105. Increased energy efficiency is another added benefit of eliminating the air flow through primary air path walls 105 during periods of operation when additional air conditioning is not required by the controlled space.

FIG. 1D illustrates the free flowing air flow path 126 through the primary air path treatment components and through the primary and secondary bypass path ways. The optional primary air treatment face dampers 110, and bypass dampers 108, 109 may be, but are not limited to, modulated and closed or open fully to offer a high level of air conditioning climate control. In one instance, where free cooling is favorable due to suitable outside air conditions, all U-shaped air treatment arrangement dampers 108, 109, 110 may be fully opened to relieve air pressure drop across the air handling unit system. As previously mentioned, lowering the air pressure drop on the system can result in better energy efficiencies from lower fan power consumptions. In addition to the air flow leaving each air treatment component path mentioned formerly, the inclusion of bypass air flow from the primary bypass air wall 104 intertwines with the primary air flow treatment walls 105 more evenly mixed in the U-shaped air treatment arrangement air handling unit, thus eliminating the need for an air de-stratification device. In another instance, such as, but not limited to, emergency operation wherein maximum air flow from the air handling unit is demanded, opening all face dampers and bypass dampers significantly reduces the air flow resistance through the air handling unit, thus delivering substantially more air flow to the conditioned space maintained by the air handling unit.

Independent air flow paths through face dampers 110 and bypass dampers 108 and 109 allow for various air handling unit operation strategies. One example is a unit with dual operation modes that uses primary air flow path as cooling mode, and bypass airflow path as heating mode, and vice versa. This could be achieved by adding an air conditioning device 122 to the bypass air path.

Figure 3A:
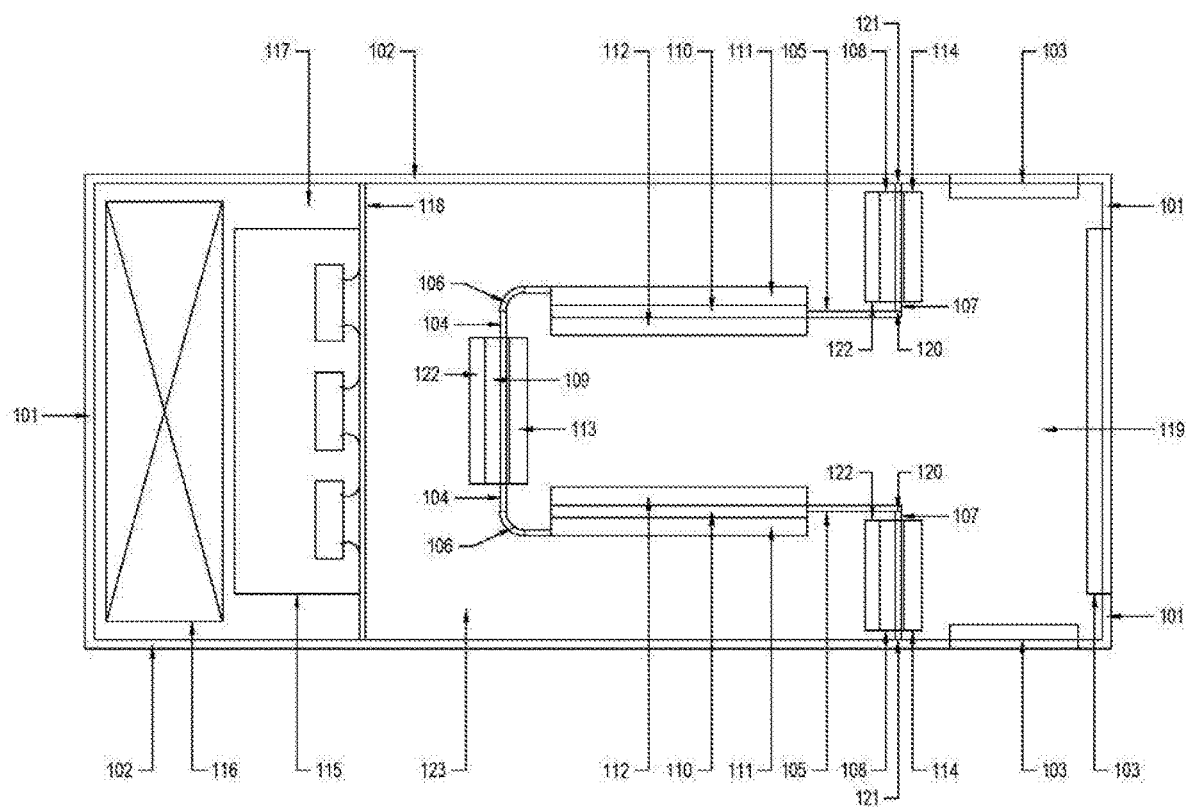
FIG. 3A is a plan view of the air handling unit with a reversed U-shaped air treatment arrangement of FIG. 1A shown in relation to typical air condition components such as, but not limited to fans, heat exchangers, economizers, filters, dampers, discharge and intake openings and other air controlling devices.
Figure 3B:
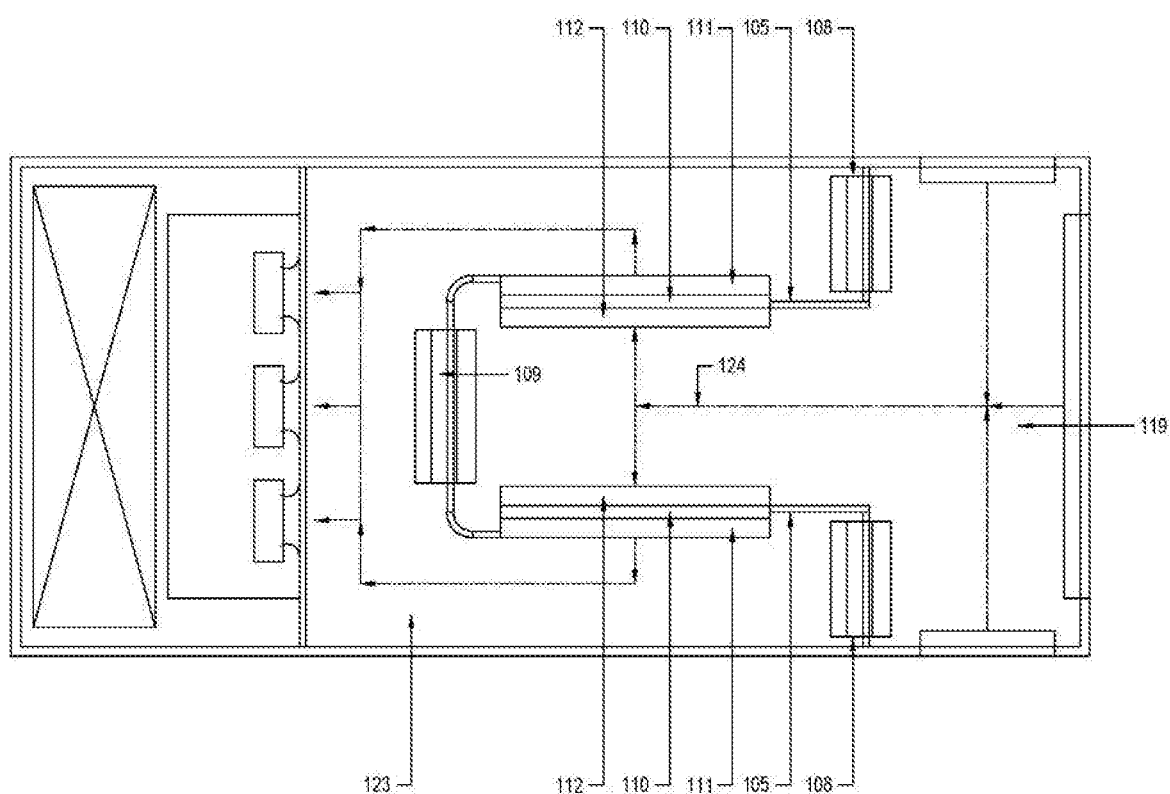
FIG. 3B is the plan view of the air handling unit displaying the unrestricted airflow pattern through primary air conditioning components installed in the reversed U-shaped arrangement with no air bypassing.
Figure 3C:
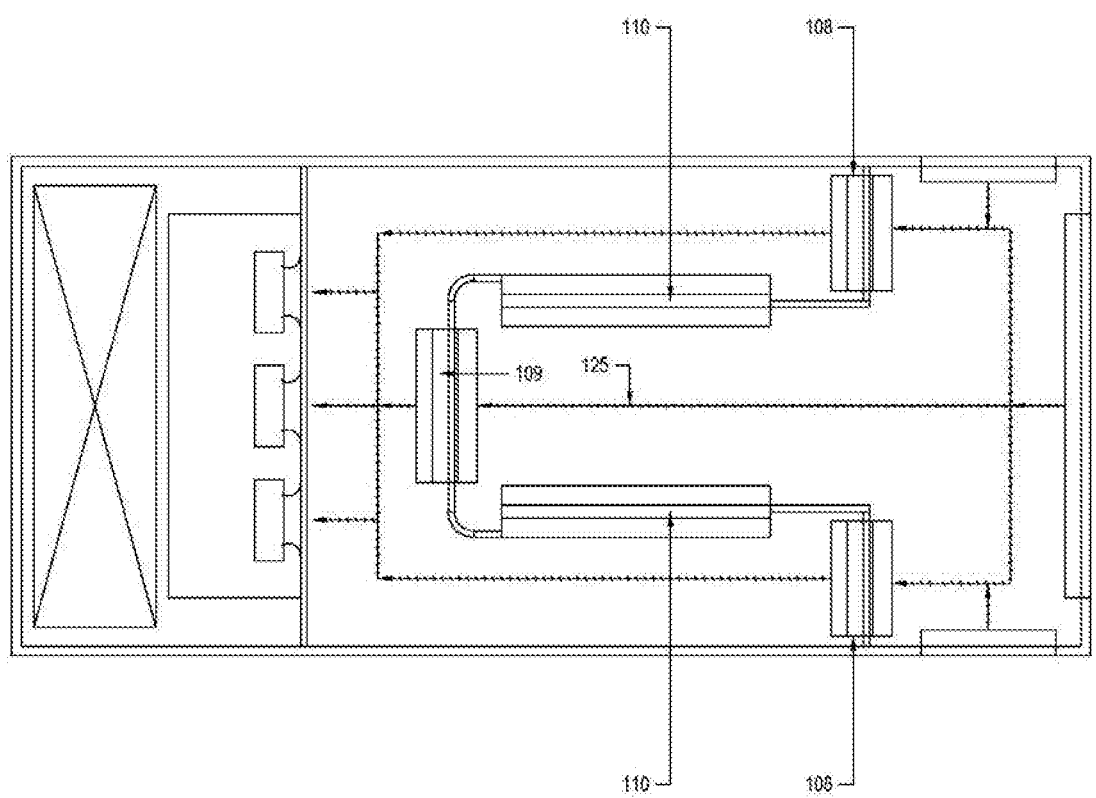
FIG. 3C is the plan view of the air handling unit displaying the airflow bypassing the primary air conditioning components installed in the reversed U-shaped arrangement.
Figure 3D:
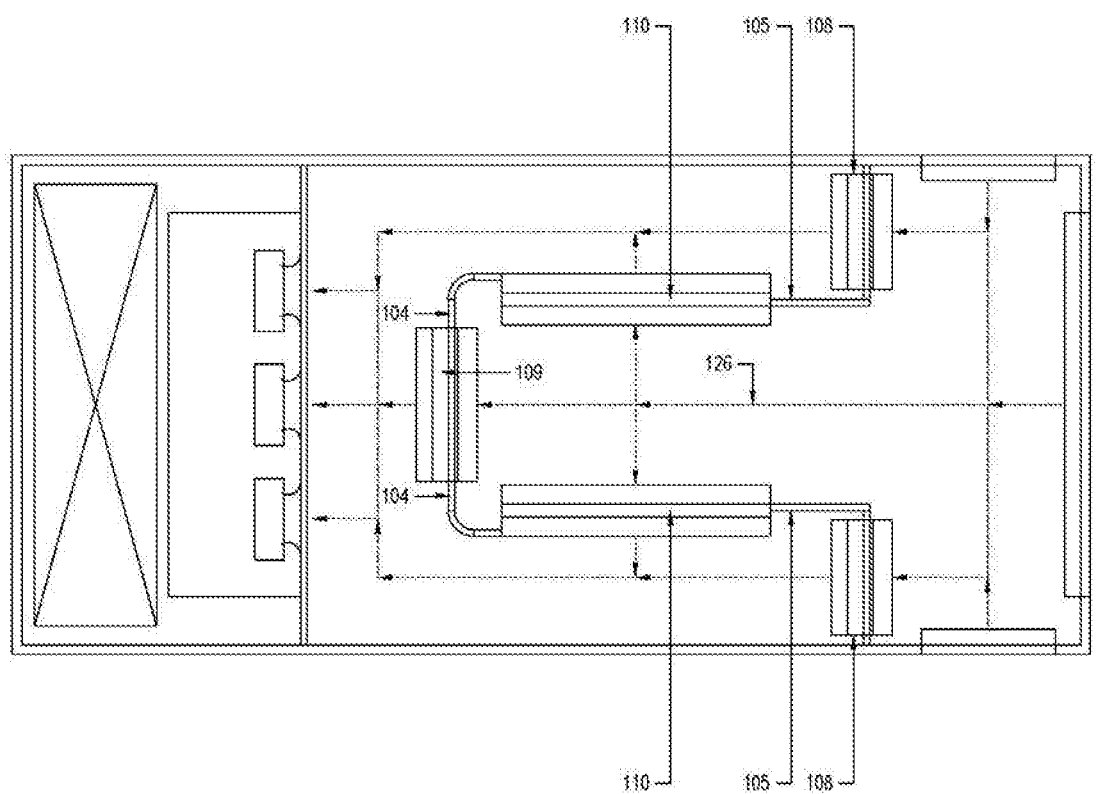
FIG. 3D is the plan view of the air handling unit displaying the airflow partially bypassing and partially through the primary air conditioning components installed in the reversed U-shaped arrangement.

The U-shaped air treatment arrangement may be reversed in relation to the air flow direction in the air handling unit as depicted in FIG. 3A, wherein the primary bypass wall 104 is placed furthest away from the air intake(s) 103, and the secondary bypass wall 107 is placed upfront facing the air flow incoming direction. Installation of components in the primary air path walls 105 is adjusted so that air flows through the air filtration bank 112 and air conditioning component 111 in sequence. In the bypass walls 104, and 107, optional air conditioning component(s) 122 are installed downstream of the bypass filter bank 113, and 114. Filter banks 112, 113, and 114 are installed upstream of the face dampers 110, and bypass dampers 108 109 to provide trouble-free front access for filter replacement. The airflow pattern is indicated in FIG. 3B for primary air flow path 124, in FIG. 3C for bypass air flow paths 125, and free flowing air flow path 126. Similar operation as mentioned above of the face dampers 110 and bypass dampers 108 and 109 is engaged to provide various flow pattern.

Figure 4:
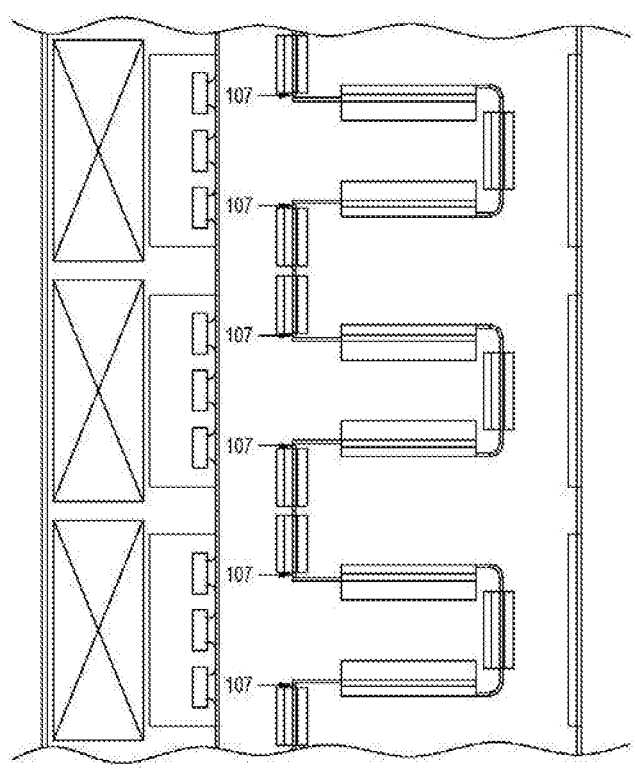
FIG. 4 is the plan view of the air handling unit displaying the scalability of multiple U-shaped air treatment arrangements within a single air handling unit.

The U-shaped air treatment arrangement may be scaled as shown in FIG. 4, wherein multiple U-shaped air treatment arrangement is connected at the secondary bypass walls 107. The scalability of the U-shaped air treatment arrangement provides added flexibility of increasing airflow, independently controlled air treatment components, and various available flow patterns.

The aforementioned demonstrates a U-shaped air treatment arrangement air handling unit application where primary and bypass air flow is achieved within a limited footprint, while maintaining preferred industry standard or reduced airflow velocity across air conditioning component(s). The U-shaped air treatment arrangement promotes good air stream mixing, provides the ability to relieve air pressure drop across the system leading to increased energy efficiency and independent air paths.

The present invention is not to be limited in scope by the specific embodiments described herein. Indeed, various modifications of the invention in addition to those described herein will become apparent to those skilled in the art from the foregoing description. Such modifications are intended to fall within the scope of the appended claims.

All patents, applications, publications, test methods, literature, and other materials cited herein are hereby incorporated by reference.

The invention claimed is:

1. An air handling unit comprising a U-shaped air treatment arrangement, which U-shaped air treatment arrangement extends between longitudinal walls, floor and ceiling of the air handling unit, thereby defining an air intake zone and an air outflow zone within the air handling unit, which U-shaped air treatment arrangement comprises, beginning at a first longitudinal wall of the air handling unit, a first secondary bypass wall, connected perpendicular to the first longitudinal wall, the first secondary bypass wall is connected in a perpendicular manner to a first primary air path wall running parallel to the first longitudinal wall, the first primary air path wall is connected via a first corner connection piece to a primary bypass wall which is positioned perpendicular to the first primary air path wall and distal from the first secondary bypass wall along the first primary air path wall, the primary bypass wall is connected via a second corner connection piece perpendicular to a second primary air path wall running parallel to the first primary air path wall and a second longitudinal wall of the air handling unit, the second primary air path wall is connected in a perpendicular manner to a second secondary bypass wall, which second secondary bypass wall is connected in a perpendicular manner to the second longitudinal wall, wherein, in conjunction with the floor and ceiling of the air handling unit, the afore-described U-shaped air treatment arrangement completely divides the air handling unit into an air intake zone and an air outflow zone, and wherein the bypass wall are equipped with bypass dampers, and optionally air filtration or air conditioning component(s), and the primary air path walls are equipped with air conditioning components and air filtration, and optionally face dampers.

2. The air handling unit of claim 1, wherein the bypass walls are parallel to terminal walls at each end of the longitudinal walls, while the primary air path walls are substantially parallel to the longitudinal walls.

3. The air handling unit of claim 1, wherein symmetrical construction along the longitudinal center line facilitates even airflow distribution in each primary air flow path.

4. The air handling unit of claim 1, which exhibits reduced airflow face velocity across primary air conditioning components and independently adequate sized bypass air flow paths within a reduced unit footprint compared to a conventional air handling unit with primary air treatment arrangements installed perpendicular to the airflow.

5. The air handling unit of claim 1, which provides independent airflow paths through primary air path walls, and bypass walls, thereby enabling the air handling unit to be multi-functional under various operating strategies and to be more energy efficient.

6. The air handling unit of claim 1, wherein both the primary air face dampers and the bypass dampers are modulated together to provide greater levels of climate control.

7. The air handling unit of claim 1, wherein, in one application, the primary air path walls are used for primary air flow conditioning, and the bypass walls are used for bypass airflow.

8. The air handling unit of claim 1, wherein primary air flow conditioning is staged by closing one of two face dampers.

9. The air handling unit of claim 1, wherein air filters are installed in parallel juxtaposition to the air conditioning device facilitating pressure equalization and enabling even airflow distribution through air conditioning device.

10. The air handling unit of claim 1, wherein in one application the primary air path walls are used for cooling, while the bypass walls are used for heating, and vice versa.

* * * * *